US006764874B1

(12) United States Patent
Zhang et al.

(10) Patent No.: US 6,764,874 B1
(45) Date of Patent: Jul. 20, 2004

(54) METHOD FOR CHEMICAL VAPOR DEPOSITION OF SINGLE WALLED CARBON NANOTUBES

(75) Inventors: Ruth Yu-Ai Zhang, Gilbert, AZ (US); Islamshah Amlani, Chandler, AZ (US); Jeffrey H. Baker, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/356,217

(22) Filed: Jan. 30, 2003

(51) Int. Cl.$^7$ ............................................. H01L 51/40
(52) U.S. Cl. ........................... 438/99; 257/24; 257/368
(58) Field of Search ........................... 438/99; 430/311; 427/227, 592; 257/368, 9, 24

(56) References Cited

U.S. PATENT DOCUMENTS

| | | | |
|---|---|---|---|
| 5,773,921 A | | 6/1998 | Keesmann et al. |
| 5,872,422 A | | 2/1999 | Xu et al. |
| 6,129,901 A | * | 10/2000 | Moskovits et al. ....... 423/447.3 |
| 6,146,227 A | * | 11/2000 | Mancevski .................. 445/24 |
| 6,203,864 B1 | * | 3/2001 | Zhang et al. ............... 427/592 |
| 6,333,016 B1 | * | 12/2001 | Resasco et al. ......... 423/447.3 |
| 6,350,488 B1 | * | 2/2002 | Lee et al. ................. 427/249.1 |
| 6,420,092 B1 | * | 7/2002 | Yang et al. ................. 430/311 |
| 6,440,761 B1 | * | 8/2002 | Choi ............................ 438/20 |
| 6,445,006 B1 | * | 9/2002 | Brandes et al. ............... 257/76 |
| 6,514,113 B1 | | 2/2003 | Lee et al. |
| 6,515,339 B2 | * | 2/2003 | Shin et al. .................. 257/368 |
| 6,593,166 B1 | * | 7/2003 | Silverbrook ................. 438/99 |
| 6,596,187 B2 | * | 7/2003 | Coll et al. ..................... 216/56 |
| 6,689,674 B2 | * | 2/2004 | Zhang et al. ............... 438/584 |

OTHER PUBLICATIONS

Xu et al., "A method for fabricating large–area, patterned, carbon nanotube field emitters," Applied Physics Letters, vol. 74, No. 17, Apr. 26, 1999, pp. 2549–2551.

Fan et al., "Self–oriented regular arrays of carbon nanotubes and their field emission properties," Science, vol. 283, Jan. 22, 1999, pp. 512–514.

Suh et al, "Highly ordered two–dimensional carbon nanotube arrays," Applied Physics Letters, vol. 75, No. 14, Oct. 4, 1999, pp. 2047–2049.

Hernadi et al. "Catalytic synthesis of carbon nanotubes using zeolite support," Zeolites 17, 1996, pp. 416–423.

Murakami et al., "Field emission from well–aligned, patterned, carbon nanotube emitters," Applied Physics Letters, vol. 76, No. 13, Mar. 27, 2000, pp. 1776–1778.

Ma et al., "Polymerized carbon nanobells and their field–emission properties," Applied Physics Letters, vol. 75, No. 20, Nov. 15, 1999, pp. 3105–3107.

Li et al, "Highly–ordered carbon nanotube arrays for electronics applications," Applied Physics Letters, vol. 75, No. 3, Jul. 19, 1999, pp. 367–369.

Terrones et al., "Controlled production of aligned–nanotube bundles," Nature, vol. 388, Jul. 3, 1997, pp. 52–55.

Xu et al., "Controlling growth and field emission property of aligned carbon nanotubes on porous silicon substrates," Applied Physics Letters, vol. 75, No. 4, Jul. 26, 1999, pp. 481–483.

Tsai et al., "Bias–enchanced nucleation and growth of the aligned carbon nanotubes with open ends under microwave plasma synthesis," Applied Physics Letters, vol. 24, No. 23, Jun. 7, 1999, pp. 3462–3464.

(List continued on next page.)

*Primary Examiner*—Maria Guerrero
(74) *Attorney, Agent, or Firm*—William E. Koch

(57) ABSTRACT

A method of fabricating a nanotube structure which includes providing a substrate, depositing a supporting layer and an active catalyst film layer onto the substrate, and forming at least one nanotube on the surface of the substrate using a reaction chamber having a growth temperature of less than 850° C.

53 Claims, 4 Drawing Sheets

OTHER PUBLICATIONS

Kind et al., "Patterned films of nanotubes using microcontact printing of catalysts," Advanced Materials, 11, No. 15, 1999, pp. 1285–1289.

Nilsson et al., "Scanning field emission from patterned carbon nanotube films." Applied Physics Letters, vol. 76. No. 15, Apr. 10, 2000, pp. 2071–2073.

Kuttel et al, "Electron field emission from phase pure nanotube films grown in a methane/hydrogen plasma," Applied Physics Letters, vol. 73, No. 15, Oct. 12, 1998, pp. 2113–2115.

Ren et al., "Synthesis of large arrays of well–aligned carbon nanotubes on glass," Science, vol. 282 Nov. 6 1998, pp. 1105–1107.

Ren et al., "Growth of a single freestanding multiwall carbon nanotube on each nanonickel dot," Applied Physics Letters, vol. 75, No. 8 Aug. 23, 1999, pp. 1086–1088.

Pan et al., "Very long carbon nanotubes," Nature, vol. 394, Aug. 13, 1998, pp. 631–632.

Zhang et al., "A flat panel display device fabricated by using carbon nanotubes cathode," IEEE, 2001, pp. 193–194.

Zhong et al., "Large–scale well aligned carbon nitride nanotube films: Low temperature growth and electron field emission," Journal of Applied Physics, vol. 89, No. 11, Jun. 1, 2001, pp. 5939–5943.

Kim et al., "Growth and field emission of carbon nanotubes on electroplated Ni catalyst coated on glass substrates," Journal of Applied Physics, vol. 90, Sep. 1, 2001, pp. 2591–2594.

Gulyaev et al., "Field emitter arrays on nanotube carbon structure films," J. Vac.Sci. Technol. B 13(2), Mar./Apr. 1995, pp. 435–436.

Chernozatonskii, et al. "Nanotube carbon structure tips—a source of high field emission of electrons," Mat. Res.Soc. Symp. Proc., vol. 359. 1995 Materials Research Society, pp. 99–104.

Su et al., "A scalable CVD method for the synthesis of single–walled carbon nanotubes with high catalyst productivity," Chemical Physics Letters 322, (2000), pp 321–326.

Li et al. "Large–scale synthesis of aligned carbon nanotubes," Science, vol. 274 Dec. 6, 1996, pp. 1701–1703.

Cassell et al. "Large scale CVD synthesis of single–walled carbon nanotubes," J. Phys. Chem. B. 1999, 103, pp. 6484–6492.

Cassell et al. "Directed growth of free–standing single walled carbon nanotubes," J. Am. Chem. Soc. 1999, 121, pp. 7975–7976.

Cassell et al, "Combinatorial optimization of heterogeneous catalysts used in the growth of carbon nanotubes," Langmuir 2001, 17, pp. 260–264.

Li et al, "Large–scale synthesis of aligned carbon nanotubes," Science, vol. 274, Dec. 6, 1996, pp. 1701–1703.

* cited by examiner

METHOD FOR CHEMICAL VAPOR DEPOSITION OF SINGLE WALLED CARBON NANOTUBES

FIELD OF THE INVENTION

This invention relates generally to the fabrication of a nano-supported catalyst on a substrate, and more particularly to a method of fabricating a nano-supported catalyst using a thin film deposition approach on a substrate for single walled carbon nanotube growth in a reaction chamber.

BACKGROUND OF THE INVENTION

Carbon is one of the most important known elements and can be combined with oxygen, hydrogen, nitrogen and the like. Carbon has four known unique crystalline structures including diamond, graphite, fullerene and carbon nanotubes. In particular, carbon nanotubes refer to a helical tubular structure grown with a single wall or multi-wall, and commonly referred to as single-walled nanotubes (SWNTs), or multi-walled nanotubes (MWNTs), respectively. These types of structures are obtained by rolling a sheet formed of a plurality of hexagons. The sheet is formed by combining each carbon atom thereof with three neighboring carbon atoms to form a helical tube. Carbon nanotubes typically have a diameter in the order of a fraction of a nanometer to a few hundred nanometers.

Carbon nanotubes can function as either a conductor, like metal, or a semiconductor, according to the rolled shape and the diameter of the helical tubes. With metallic nanotubes, it has been found that a one-dimensional carbon-based structure can conduct a current at room temperature with essentially no resistance. Further, electrons can be considered as moving freely through the structure, so that metallic nanotubes can be used as ideal interconnects. When semiconductor nanotubes are connected to two metal electrodes, the structure can function as a field effect transistor wherein the nanotubes can be switched from a conducting to an insulating state by applying a voltage to a gate electrode. Therefore, carbon nanotubes are potential building blocks for nanoelectronic devices because of their unique structural, physical, and chemical properties.

Existing methods for the production of nanotubes, include arc-discharge and laser ablation techniques. Unfortunately, these methods typically yield bulk materials with tangled nanotubes. Recently, reported by J. Kong, A. M. Cassell, and H Dai, in Chem. Phys. Lett. 292, 567 (1988) and J. Hafner, M. Bronikowski, B. Azamian, P. Nikoleav, D. Colbert, K. Smith, and R. Smalley, in Chem. Phys Lett. 296, 195 (1998) was the formation of high quality individual single-walled carbon nanotubes (SWNTS) demonstrated via thermal chemical vapor deposition (CVD) approach, using Fe/Mo or Fe nanoparticles as a catalyst. The CVD process has allowed selective growth of individual SWNTs, and simplified the process for making SWNT based devices. However, the choice of catalyst materials that can be used to promote SWNT growth in a CVD process has been limited to only Fe/Mo nanoparticles. Furthermore, the catalytic nanoparticles were usually derived by wet chemical routes, which are time consuming and difficult to use for patterning small features.

Another approach for fabricating nanotubes is to deposit metal films using ion beam sputtering to form catalytic nanoparticles. In an article by L. Delzeit, B. Chen, A. Cassell, R. Stevens, C. Nguyen and M. Meyyappan in Chem. Phys. Lett. 348, 368 (2002), CVD growth of SWNTs at temperatures of 900° C. and above was described using Fe or an Fe/Mo bi-layer thin film supported with a thin aluminum under layer. However, the required high growth temperature prevents integration of CNTs growth with other device fabrication processes.

Ni has been used as one of the catalytic materials for formation of SWNTs during laser ablation and arc discharge process as described by A. Thess, R. Lee, P. Nikolaev, H. Dai, P. Petit, J. Robert, C. Xu, Y. H. Lee, S. G. Kim, A. G. Rinzler, D. T. Colbert, G. E. Scuseria, D. Tomanet, J. E. Fischer, and R. E. Smalley in Science, 273, 483 (1996) and by D. S. Bethune, C. H. Kiang, M. S. de Vries, G. Gorman, R. Savory, J. Vazquez, and R. Beyers in Nature, 363, 605 (1993). However, attempts to use a solution based Ni catalyst to grow individual SWNTs by CVD has not been successful. Additionally, although a thin Ni film has been widely used to produce MWNTs, growth of SWNTs using a Ni thin film as the active catalyst film layer has not been achieved.

Accordingly, it is an object of the present invention to provide a new and improved approach for providing a nano-supported catalyst on a substrate for single-walled nanotube growth that allows such nanotubes to be grown at temperatures below 850° C. on the substrate using a simplified method that achieves growth of individual single-walled nanotubes, while maintaining the ability to control the density of the SWNTs. The reduced growth temperature also allows one to grow SWNTs on top of pre-patterned metallic electrodes, such as gold, which facilitates electrical field directed SWNTs growth. Furthermore, additional desirable features will become apparent to one skilled in the art from the drawings, foregoing background of the invention and following detailed description of a preferred exemplary embodiment, and appended claims.

SUMMARY OF THE INVENTION

To achieve the objects and advantages specified above and others, a method of fabricating a nanotube structure is disclosed which includes providing a substrate, providing a catalyst film comprised of an active film layer supported by a supporting layer, deposited onto the substrate. Single-walled nanotubes are formed from the catalyst using a reaction chamber with a hydrocarbon gas atmosphere at elevated temperatures.

BRIEF DESCRIPTION OF THE DRAWINGS

The foregoing and further and more specific objects and advantages of the instant invention will become readily apparent to those skilled in the art from the following detailed description of the preferred embodiments thereof taken in conjunction with the following drawings.

DETAILED DESCRIPTION OF THE PREFERRED EMBODIMENTS

Figure 1:
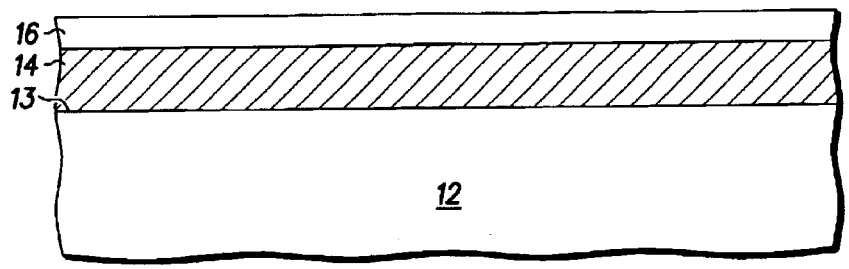
FIGS. 1–3 are cross sectional views of the steps in a sequence of fabricating a first embodiment of a nanotube structure according to the present invention.

Turn now to the drawings, FIG. 1 illustrates a step in a method to fabricate a nanotube structure 10 in accordance with a first embodiment of the present invention. In the first preferred embodiment, nanotube structure 10 includes a substrate 12 wherein substrate 12 includes silicon. However, it will be understood that other substrate materials may be appropriate, such as a glass, a ceramic, a metal, a sapphire, a semiconductor material, or any other material that is capable of withstanding the required growth temperature. Other semiconductor materials can include, for example, germanium (Ge) or the like. Further, substrate 12 can include control electronics or other circuitry, which are not shown in this embodiment for simplicity. Also, substrate 12 can include an insulating layer, such as silicon dioxide ($SiO_2$), silicon nitride (SiN), or the like.

In this first preferred embodiment, a thin nickel (Ni) film supported by an underlayer was used as catalyst for SWNTs growth. More specifically, a thin underlayer of a supporting material 14 is deposited on an uppermost surface 13 of substrate 12. Supporting material 14, in this particular embodiment is aluminum (Al), but alternate metal underlayer materials, such as Iridium (Ir), or the like, are anticipated by this disclosure. Typically, a Si wafer coated with a 200 nm-thick thermally grown $SiO_2$ layer is used as starting substrate 12. Supporting material 14 is deposited on substrate 12, and an active catalyst film 16 is next deposited on an uppermost surface of supporting material 14. Active catalyst film 16 is disclosed as being nickel (Ni), but alternatively can be formed of alloys made of transition metal, namely Fe/Co or Fe/Ni. In a preferred embodiment, supporting material 14 and Ni catalyst film 16 are deposited on substrate 12 by electron-beam evaporation. It should be understood that alternate deposition methods are anticipated by this application, including inductive heating evaporation and various sputter deposition approaches.

It is disclosed that active catalyst film 16 is chosen from the disclosed materials to provide for ease in fabrication. Ni, and Fe/Co and Fe/Ni alloys, have been found to be easy to deposit using either evaporation or sputtering processes, the thickness of the resultant layer is controllable, and formed as a single layer. Active catalyst film 16 can be stated as having a formula of $Fe_xCo_yNi_z$, where $x+y+z=1$ and where $y+z\neq 0$. The prior art which teaches the use of iron (Fe), or separate Fe and molybdenum (Mo) layers as active catalyst layers, are relatively difficult to deposit during evaporation and therefore, difficult to control the thickness of the catalyst layer. Furthermore, the catalyst layer formed of Ni, Fe/Co, Fe/Ni, or in general $Fe_xCo_yNi_z$, has melting point lower than Fe layer, or Fe/Mo bi-layer film, and thus will undergo a reaction in the reaction chamber at a lower temperature, typically less than 850° C., than is required for materials having a higher melting point. The higher melting points of Fe and Mo require higher temperatures during processing in a reaction chamber.

Figure 2:
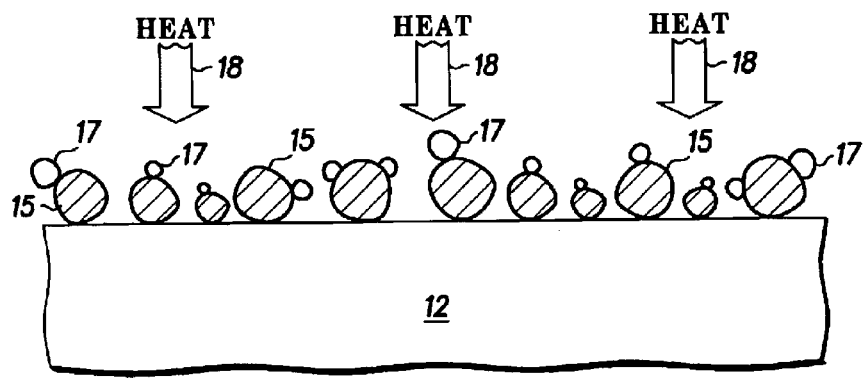

Turning now to FIG. 2, thin film structure 10 is placed in a reaction chamber with a hydrocarbon gas atmosphere to form at least one single-walled nanotube (discussed presently). The reaction chamber can include a chemical vapor deposition chamber, a chemical beam epitaxy chamber, a molecular beam epitaxy chamber, or the like. Further, in the preferred embodiment, the hydrocarbon gas atmosphere includes methane. However, it will be understood that the hydrocarbon gas atmosphere can include other gases, such as ethylene, acetylene, carbon monoxide, or the like.

In a preferred embodiment and during experimentation, CNT growth is performed in a CVD reactor. Gas flow rates are controlled using mass flow controllers, and reaction pressure is regulated by a capacitance manometer that has a feedback control to the pump inlet valve. During experimentation, after loading structure 10 into the furnace, the reactor was evacuated to a base pressure of $1\times 10^{-6}$ Torr with a turbo molecular pump. Structure 10 was first heated to 200° C. under vacuum and maintained at that temperature for 30 minutes. As illustrated in FIG. 2, under the application of heat (indicated by arrows 18) supporting layer 14 melts forming droplets (discussed presently) and active catalyst film layer 16 forms Ni catalytic nanoparticles (discussed presently).

Figure 3:
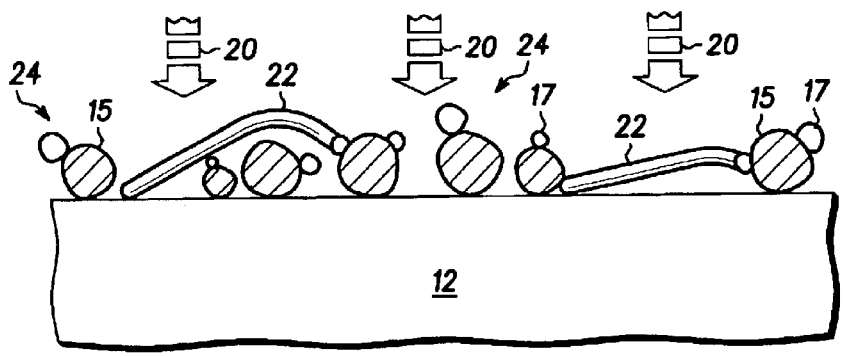

As illustrated in FIG. 3, hydrogen ($H_2$) gas 20 is next introduced while the tube is gradually heated up to a growth temperature of less than 850° C. During experimentation, growth of a single-walled nanotube 22 was initiated at 800° C. by adding methane ($CH_4$) to the gas flow.

For the growth of SWNTs 22, the experimental results indicated that a Ni active catalyst film layer 16 with thickness in the range of 1–5 nm, and an Al supporting layer 14 with thickness in the range of 2–10 nm are required, and the density of SWNTs 22 varies with the Al supporting layer 14 and/or Ni active catalyst film layer 16 thickness. Experiments with varying thicknesses for the Ni active catalyst film layer 16 and Al supporting layer 14 were conducted, with samples including 1 nm/4 nm, 1 nm/6 nm, 1 nm/10 nm, and 5 nm/10 nm, respectively. It was found that for a fixed Ni active catalyst film layer 16 thickness of 1 nm, the density increases with Al supporting layer 14 thickness. Examining the surface morphology underneath CNTs 22 showed clusters 24 of various size and density. The size of clusters 24 decreases with increasing Al supporting layer 14 thickness, while the density increases as Al supporting layer 16 thickness increases. Clusters 24 are formed by the break down of the underlying Al supporting layer 14 as illustrated in FIG. 2. As illustrated in FIG. 2, when substrate 12 is heated up to 800° C., Al supporting layer 14 melts and form small droplets 15 which oxidize quickly to form thermally stable $Al_3O_2$ particles, which in turn serves as support for the Ni catalytic nanoparticles 17 formed when Ni active catalyst film layer 16 reacts to heat 18. With larger supporting clusters 24, there is a higher probability for Ni active catalyst film layer 16 to form bigger particles on the cluster surface. The low methane flow rate and reaction pressure used was found to be insufficient to provide enough carbon supply to form supersaturated Ni carbide needed for initiating CNT growth. Therefore only the smaller Ni nanoparticles 17 become active catalyst and promote CNTs 22 growth. Since fewer small Ni nanoparticles 17 are formed with larger Al cluster 24, lower density of CNTs 22 is thus expected from a thinner Al supporting layer 14. With increasing Al supporting layer 14 thickness, the size of supporting clusters 24 decreases, and the density of smaller Ni nanoparticles 17 increases. Therefore the number of CNTs 22 increases.

If the thickness of Al supporting layer 14 is kept constant and the thickness of the Ni active catalyst film layer 16 is increased, an opposite trend is observed, i.e., CNT 22 density decreases with increasing Ni active catalyst film layer 16 thickness. This again can be explained by formation of larger catalyst particles with a thicker Ni active catalyst film layer 16. In addition, a thick Ni active catalyst film layer may prevent oxidization of the underlying Al materials. Interdiffusion between Ni and Al causes part of the Ni to migrate underneath the Al supporting layer 14, and reduces the density of Ni nanoparticles 17 on the top surface, therefore CNTs 22 density decreases as a result of reduced number of active Ni catalytic nanoparticles 17. It is disclosed that the optimized Ni active catalyst film layer 16 thickness for catalyzing SWNTs 22 growth is 1 nm.

Referring now to FIGS. 4–9, disclosed is a second embodiment of the steps in fabricating nanotubes according to the present invention. In this particular embodiment, growth of a SWNT circuit (discussed presently) is achieved in which the active catalyst film layer and the underlying support layer and electrode patterns are defined by photolithography using a conventional metal lift-off process. In a preferred embodiment, 20 nm thick Ti was used as the adhesion layer and 200 nm thick Au was deposited as material for the electrodes.

Figure 4:
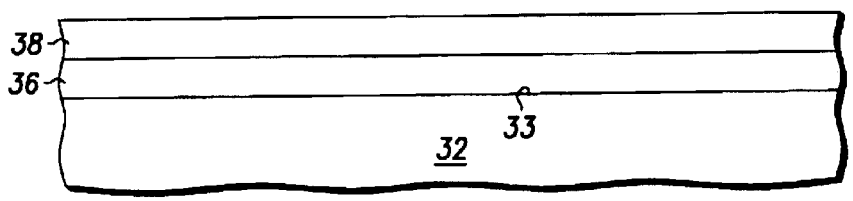
FIGS. 4–9 are cross sectional views of the steps in the sequence of fabricating a second embodiment of a nanotube structure according to the present invention.

Referring now to FIGS. 4–9, and in particular FIG. 4, a first step in the formation of a carbon nanotube circuit, generally referenced 30, includes the step of positioning a mask region 34 on surface 34 of substrate 32. In the preferred embodiment, mask region 34 includes a bi-layer resist of a photoresist layer 36 positioned on surface 33 and a photoresist layer 38 positioned on layer 36. A bi-layer resist is used in the preferred embodiment to facilitate the lift-off process, as will be discussed separately.

Figure 5:
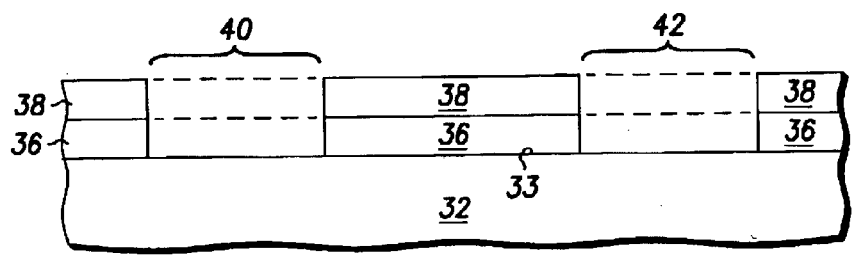

As illustrated in FIG. 5, mask region 34 is patterned and etched through layers 36 and 38 to form at least one trench. In the preferred embodiment, a trench 40 and a trench 42 are formed within mask region 34, but it will be understood that it is anticipated that an array of trenches could be formed therewith. In this embodiment, two trenches are illustrated for simplicity and ease of discussion. Further, mask region 34 can be patterned using optical lithography, e-beam lithography, or other techniques well known to those skilled in the art.

Figure 6:
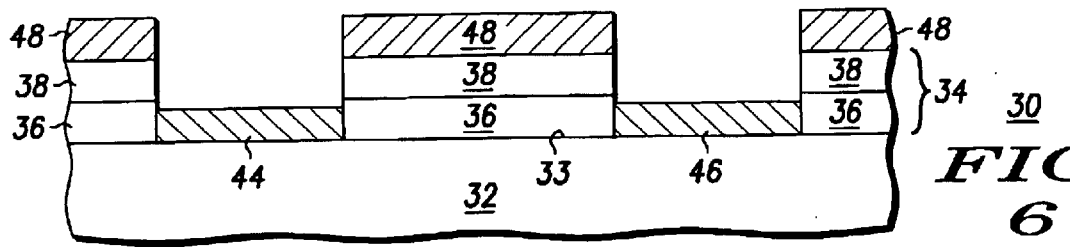

Turning now to FIG. 6, a conductive material layer 44 is deposited on surface 33 within trench 40 and a conductive material layer 46 is deposited on surface 33 within trench 42. Further, it is anticipated that a conductive material layer 48 will be formed on mask region 34 as illustrated. In the preferred embodiment, layers 44, 46, and 48 include gold (Au), but it will be understood that other conductive materials, such as aluminum (Al), platinum (Pt), silver (Ag), copper (Cu), or the like, may be used.

Further, in the illustrated embodiment, layers 44 and 46 are illustrated to include the same conductive material for simplicity, but it will be understood that they can include different conductive materials when defined using multiple processing steps. For example, layer 44 can include gold (Au) and layer 46 can include platinum (Pt) wherein it will be understood that the fabrication sequence would be, in general, different from the preferred embodiment. However, the differences are well known to those skilled in the art and will not be elaborated upon further here. It is additionally anticipated by this disclosure that in an alternative embodiment conductive material layers 44 and 46 can be deposited directly on surface 33 of substrate 32 using focused ion beam processing techniques.

Figure 7:
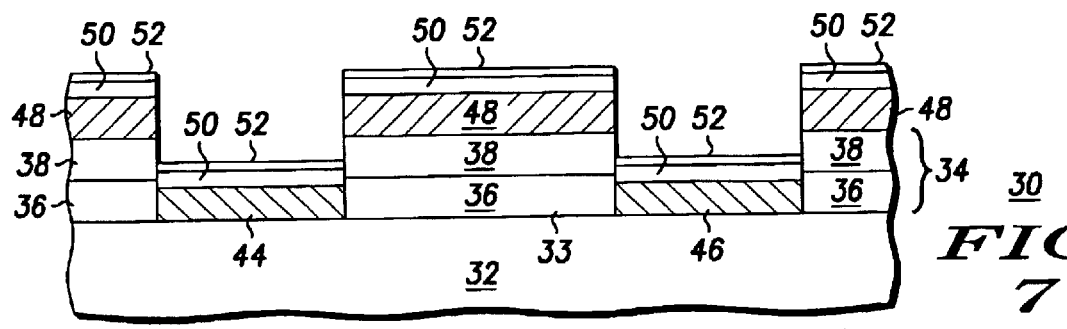

Turning now to FIG. 7, a supporting layer 50, generally similar to supporting layer 14 of FIGS. 1–3, is deposited on conductive material layer 44 and 46. Next, an active catalyst film layer 52, generally similar to active catalyst film layer 16 of FIGS. 1–3, is deposited on supporting layer 50. Electron-beam evaporation provides for control in depositing supporting layer 50 and active catalyst film layer 52, yet other means of deposition such as sputtering, or the like, are anticipated by this disclosure.

Figure 8:
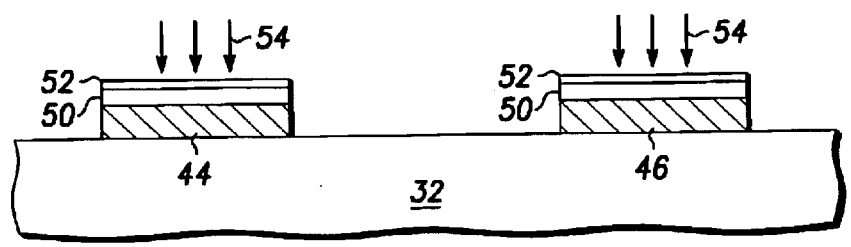
Figure 9:
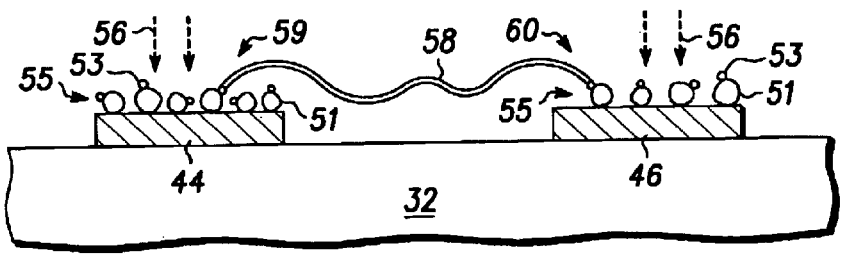
Figure 10:
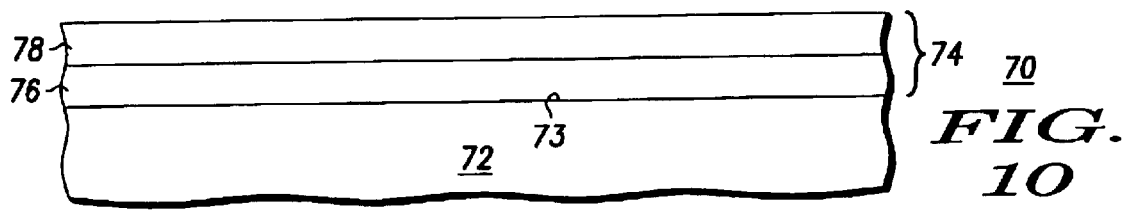
FIGS. 10–19 are cross sectional views of the steps in the sequence of fabricating a third embodiment of a nanotube structure according to the present invention.

Turning now to FIG. 8, a lift-off process is performed to remove mask region 34 from substrate 30. Similar to the first embodiment, CNT growth is performed in a hot wall reactor. During fabrication, after loading structure 30 into the furnace, the reactor is evacuated to a base pressure of $1 \times 10^{-6}$ Torr with a turbo molecular pump. The tube is first heated to 200° C. under vacuum and maintained at that temperature for 30 minutes. As illustrated in FIGS. 8 and 9, under the application of heat (indicated by arrows 54) supporting layer 50 melts forming droplets 51, and active catalyst film layer 52 forms Ni catalytic nanoparticles 53 as illustrated in FIG. 9. Droplets 51 and nanoparticles 53 in combination define a plurality of clusters 55 formed by the break down of the underlying Al supporting layer 50.

As illustrated in FIG. 9, hydrogen ($H_2$) gas 56 is next introduced while the tube is gradually heated up to a growth temperature of less than 850° C. Growth of a suspended single-walled nanotube 58 is initiated at approximately 800° C. by adding methane ($CH_4$) to gas flow 56. More specifically, once the temperature of the substrate 32 is elevated to the growth temperature, a carbon source is preferably introduced into the CVD growth chamber. Any hydrocarbon or carbon-compound (e.g., methane, carbon monoxide, etc.) can be used as the carbon source. For example, a gas mixture of hydrogen ($H_2$) and methane ($CH_4$) can be used as the hydrocarbon source, with a flow rate of about forty standard cubic centimeters per minute (40 sccm) for hydrogen and about sixty standard cubic centimeters per minute (60 sccm) for methane. Hydrogen gas is added to the gas flow to prevent the catalyst particle from getting poisoned during the SWNT growth process. The ratio of the methane ($CH_4$) to hydrogen ($H_2$) is preferably maintained with the range of twenty percent (20%) to eighty percent (80%) and the pressure of the CVD growth chamber is maintained at about twenty (20) torr to one hundred (100) torr. The simultaneous production of atomic hydrogen during hydrocarbon pyrolysis enhances the deposition of the carbon nanotubes 58 and the growth of the carbon nanotubes 58 is discontinued when the length of the carbon nanotubes 58 is a desired length for a particular application (e.g., the tips of the carbon nanotubes 58 have grown to level of the gate aperture). In the preferred embodiments, an end 59 of nanotube 58 is electrically connected to conductive material layer 44 and an end 60 is electrically connected to conductive material layer 46. Nanotube 58 is described as "suspended" in that it is not formed directly on the surface of substrate 32. During the formation of nanotube 58, an electric field may be applied between layers 44 and 46 to align nanotube 58 in a preferred direction and facilitate the electrical connection therewith.

One may speculate that Al supporting layer 50 and Ni active catalyst film layer 52 may provide direct metallic contact between SWNTs 58 and the substrate 32 due to the metallic nature of the layers 50 and 52. To evaluate the contact resistance between SWNTs 58 and substrate 32, Ni active catalyst film layer 50 and supporting layer 52 are patterned on top of the Au electrodes 44 and 46, and then performed the CVD process on such patterned wafer to grow SWNTs bridging the two opposite Au electrodes 44 and 46. A typical CNT circuit is illustrated in FIG. 9, where SWNT 58 originates from the top of electrode 44, grows and lands itself to electrode 46 on the opposite side, and forms top contact with the contact pads. Measurements for numerous circuits were performed, and it was found that the contact resistance varies in the range of a few hundred MΩ to a few hundred KΩ. The contact resistance is sensitive to the thickness of Al supporting layer 50. When the densities of catalyst particles and supporting nanoclusters are low, exposed Au areas are left remaining on electrodes 44 and 46. In this case, the contact resistance varies from circuit to circuit within the same wafer, and ranges from a few hundred KΩ to a few tens MΩ depending upon the originating and landing locations of SWNTs 58 on top of electrodes 44 and 46. Results indicate that oxidized Al clusters (as previously described with respect to FIGS. 1–3) are highly resistive preventing the formation of a good ohmic contact. In addition, the electronic transport properties of SWNT bridge 58 grown using this Ni active catalyst film layer 52 and Al supporting layer 50 were measured by applying a gate voltage to substrate 32. Results indicated that approximately 80% of CNTs 58 show p-type semiconducting behavior.

Figure 11:
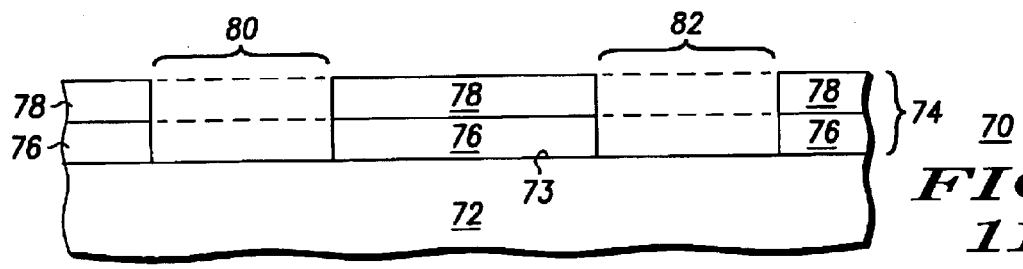
Figure 12:
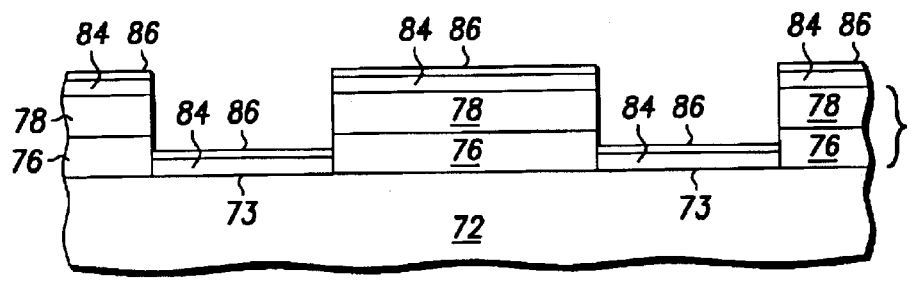

Referring now to FIGS. 10–19, disclosed is a third embodiment of the steps in fabricating nanotubes according to the present invention. In this particular embodiment, selective growth of a SWNT circuit 70 (generally similar to circuit 30 previously discussed with respect to FIGS. 4–9) is achieved in which the active catalyst film layer and the underlying support layer are defined by lithography. In this particular embodiment, in contrast to the embodiment disclosed in FIGS. 4–9, electrodes are formed subsequent to the fabrication of the CNTs on the surface of the substrate, or the catalyst film is placed only on a small area of the electrode. Similar to the previous circuit embodiment, a mask (comprising photoresist layers, or dielectric materials) layer 74, is deposited on uppermost surface 73 of a substrate 72. In an alternate embodiment, uppermost surface 73 of substrate 72 consists of predefined electrodes or circuits. As illustrated in FIG. 11, lithography is used to define a plurality of trenches 80 and 82, or wells, in which deposition of a supporting layer 84 and an active catalyst film layer 86 takes place as illustrated in FIG. 12. Anticipated by this application is the direct deposition of supporting layer 84 and active catalyst film layer 86 on uppermost surface 73 of substrate 72 and subsequent defining of the CNTs by etching away portions of supporting layer 84 and active catalyst film layer 86 that are not desired.

Figure 13:
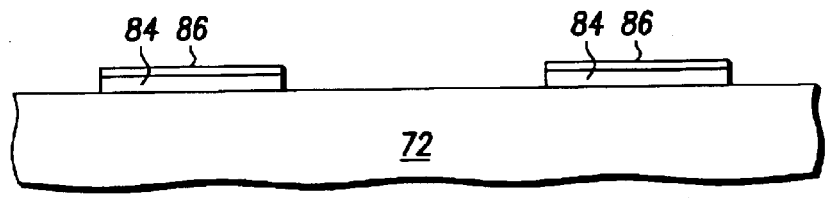
Figure 14:
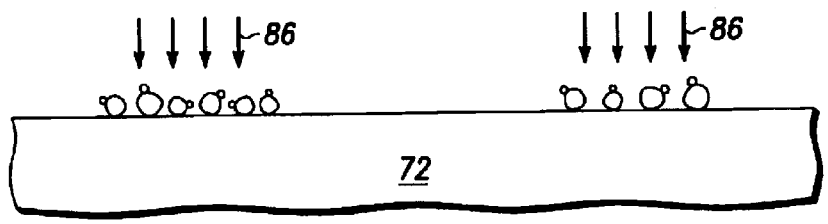

Turning now to FIG. 13, a lift-off process is performed to remove mask region 74 from substrate 70. FIGS. 10–13 illustrated a lift-off process to define catalyst features 88 on top of surface 73. However, It is understood that an etch process (not shown) can also be used to define catalyst islands 88. Similar to the previously described embodiments, CNT growth is performed in a hot wall reactor. During fabrication, after structure 70 is loaded into a furnace. Under the application of heat (indicated by arrows 88 in FIG. 14) supporting layer 84 melts forming droplets (similar to droplets 15 described with respect to FIG. 1) and active catalyst film layer 86 forms Ni catalytic nanoparticles (similar to droplets 17 described with respect to FIG. 1).

Figure 15:
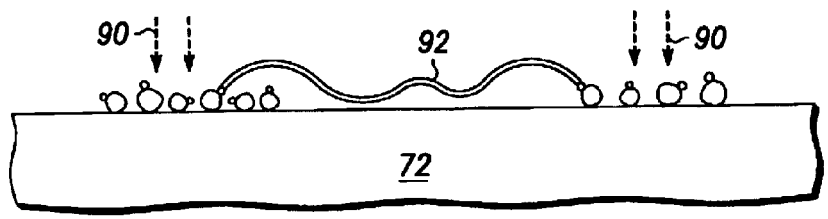
Figure 16:
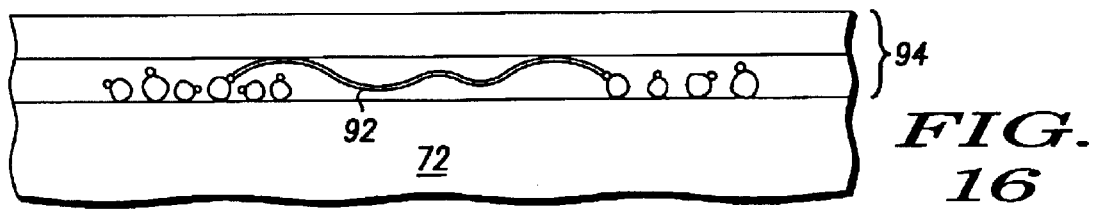
Figure 17:
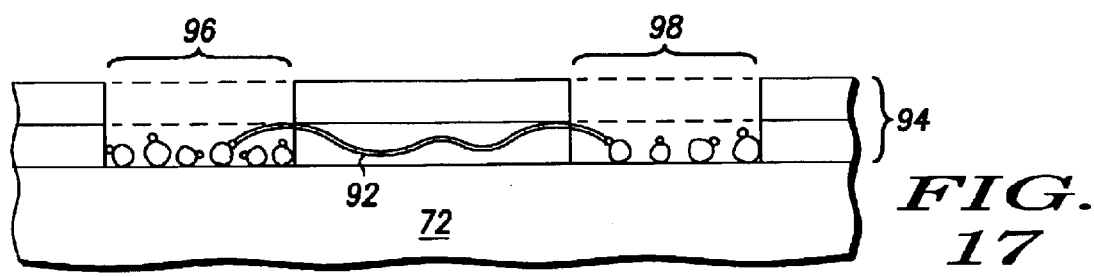

As illustrated in FIG. 15, hydrogen ($H_2$) gas 90 is next introduced while the tube is gradually heated up to a growth temperature of less than 850° C. Growth of a single-walled nanotube 92 is initiated at approximately 800° C. by adding methane ($CH_4$) to gas flow 90. More specifically, once the temperature of the substrate 72 is elevated to the growth temperature, a carbon source is preferably introduced into the CVD growth chamber. Any hydrocarbon or carbon-compound (e.g., methane, carbon monoxide, etc.) can be used as the carbon source. The simultaneous introduction of hydrogen ($H_2$) gas during hydrocarbon pyrolysis enhances the activity of the catalyst materials, and facilitates the formation of the carbon nanotubes 92. Growth of carbon nanotubes 92 is discontinued when the length of carbon nanotubes 92 reaches a desired length for a particular application (e.g., the tips of the carbon nanotubes 92 have grown to level of the gate aperture).

Figure 18:
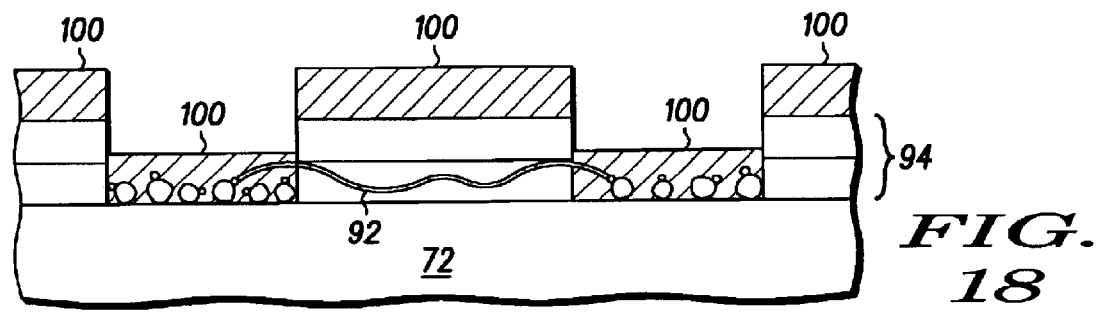

As illustrated in FIGS. 16–19, a plurality of electrodes (discussed presently) are fabricated. Similar to the previous photolithography steps, a plurality of photoresist layers 94 are deposited on an uppermost surface 73 of a substrate 72 and covering CNT 92 and catalyst clusters (previously described). Photoresist layers 94 are patterned to define a plurality of trenches 96 and 98, or wells, in which deposition of a conductive material layer 100 takes place as illustrated in FIG. 18.

Figure 19:
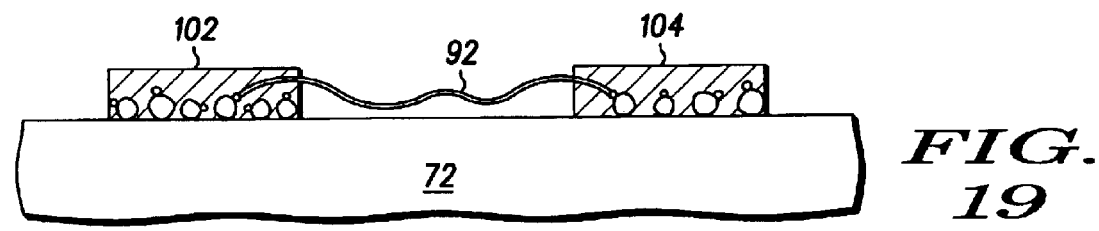

Turning now to FIG. 19, a lift-off process is performed to remove mask region 94 from substrate 72, thereby exposing defined electrodes 102 and 104 bridged by CNT 92.

In the preferred embodiments, the term "nanotube" is intended to mean a "carbon nanotube", but it will be understood that the term "nanotube" can include other nanotube forming materials, such as boron nitride (BN), with the desired electrical and physical properties.

Thus, a new and improved method of fabricating a nanotube structure has been disclosed. The method involves using a bi-layer system defined by an active catalyst film layer and underlying support layer. The active catalyst film layer is formed of a pure nickel material, or an alloy such as iron/nickel, or iron/cobalt. Conventional semiconductor processing techniques, such as e-beam evaporation and sputtering provides accurate control in the layer thickness, resulting in control in catalyst composition. Meanwhile, lithography enables precise definition in catalyst location. The material chosen provides for processing at lower reaction chamber temperatures than found in the prior art. In addition, the materials provide for greater density of CNT growth and control of the density. Further, this method allows the alignment of the nanotubes with an electric field during chemical vapor deposition processing.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A method of fabricating nanotube structures comprising the steps of:

providing a substrate with a surface;

depositing a supporting layer on a surface of the substrate;

depositing an active catalyst film layer onto a surface of the supporting layer;

transforming the supporting layer into a plurality of supporting droplets and transforming the active catalyst film layer into a plurality of active catalyst nanoparticles which adhere to the supporting layer droplets using a reaction chamber having a growth temperature of less than 850° C.; and forming at least one single walled nanotube on the surface of the substrate wherein the at least one single walled nanotube is formed from at least one of the plurality of active catalyst nanoparticles.

2. A method of fabricating nanotube structures as claimed in claim 1 wherein the step of depositing a supporting layer on the surface of the substrate includes the step of depositing a layer of aluminum (Al) on the surface of the substrate.

3. A method of fabricating nanotube structures as claimed in claim 1 wherein the step of depositing an active catalyst film layer onto the surface of the supporting layer includes the step of depositing an active catalyst film layer comprised of nickel (Ni).

4. A method of fabricating nanotube structures as claimed in claim 1 wherein the step of depositing an active catalyst film layer onto the surface of the supporting layer includes the step of depositing an active catalyst film layer comprised of a material chosen from the group consisting of: nickel (Ni), an iron/cobalt (Fe/Co) alloy, and a iron/nickel (Fe/Ni) alloy.

5. A method as claimed in claim 1 wherein the step of forming the at least one nanotube includes a step of using one of methane, ethylene, acetylene, carbon monoxide, and another suitable hydrocarbon gas atmosphere within the reaction chamber.

6. A method as claimed in claim 1 wherein the reaction chamber includes one of a chemical vapor deposition chamber, a molecular beam epitaxy chamber, a chemical beam epitaxy chamber, and another suitable chamber.

7. A method of fabricating nanotube structures as claimed in claim 1 further including the step of forming a conductive material layer on the surface of the substrate in electrical connection with the at least one nanotube.

8. A method of fabricating nanotube structures as claimed in claim 1 wherein the step of depositing an active catalyst film layer onto the surface of the supporting layer includes the step of depositing an active catalyst film layer comprised of a transition metal alloy.

9. A method of fabricating nanotube structures as claimed in claim 7 wherein the conductive material layer includes one of gold, aluminum, platinum, silver, copper, and another suitable conductive material.

10. A method of fabricating nanotube structures as claimed in claim 8 wherein the alloy is iron/cobalt (Fe/Co).

11. A method of fabricating nanotube structures as claimed in claim 8 wherein the alloy is iron/nickel (Fe/Ni) or FeNiCo.

12. A method of fabricating nanotube structures as claimed in claim 9 wherein the step of forming a conductive layer on the surface of the substrate, includes forming a plurality of electrodes in electrical connection with the at least one nanotube thereby defining a circuit.

13. A method of fabricating nanotube structures as claimed in claim 12 wherein the step of forming a plurality of electrodes in electrical connection with the at least one nanotube includes the steps of:

providing a mask region positioned on the surface of the substrate;

patterning and etching through the mask region to form at least one trench;

depositing a conductive material layer on the surface of the substrate and within the at least one trench; and removing the mask region and subsequent layers deposited thereon.

14. A method of fabricating nanotube structures as claimed in claim 13 wherein the mask region includes at least one of a dielectric material or a photoresist materials.

15. A method as claimed in claim 13 wherein the step of removing the mask region includes using one of a lift-off process or an etching process.

16. A method of fabricating nanotube structures as claimed in claim 14 wherein the mask region includes a first photoresist layer and a second photoresist layer.

17. A method of fabricating nanotube structures comprising the steps of:

providing a substrate with a surface;

depositing a supporting layer on a surface of the substrate;

depositing an active catalyst film layer comprised of nickel (Ni) onto the surface of the supporting substrate; and transforming the supporting layer into a plurality of supporting droplets and transforming the active catalyst film layer comprised of nickel (Ni) into a plurality of active catalyst nanoparticles which adhere to the supporting layer droplets using a reaction chamber having a growth temperature of less than 850° C.; and forming at least one single walled nanotube on the surface of the substrate wherein the at least one single walled nanotube is formed from at least one of the plurality of active catalyst nanoparticles.

18. A method of fabricating nanotube structures as claimed in claim 17 wherein the step of depositing a supporting layer on the surface of the substrate includes the step of depositing a layer of aluminum (Al) on the surface of the substrate.

19. A method of fabricating nanotube structures as claimed in claim 17 wherein the step of forming the at least one nanotube includes a step of using one of methane, ethylene, acetylene, carbon monoxide, and another suitable hydrocarbon gas atmosphere within the reaction chamber.

20. A method of fabricating nanotube structures as claimed in claim 17 wherein the reaction chamber includes one of a chemical vapor deposition chamber, a molecular beam epitaxy chamber, a chemical beam epitaxy chamber, and another suitable chamber.

21. A method of fabricating nanotube structures as claimed in claim 17 further including the step of forming a conductive material layer on the surface of the substrate in electrical connection with the at least one nanotube.

22. A method of fabricating nanotube structures as claimed in claim 21 wherein the conductive material layer includes one of gold, aluminum, platinum, silver, copper, and another suitable conductive material.

23. A method of fabricating nanotube structures as claimed in claim 22 wherein the step of forming a conductive layer on the surface of the substrate, includes forming a plurality of electrodes in electrical connection with the at least one nanotube thereby defining a circuit.

24. A method of fabricating nanotube structures as claimed in claim 23 wherein the step of forming a plurality of electrodes in electrical connection with the at least one nanotube includes the steps of:

providing a mask region positioned on the surface of the substrate;

patterning and etching through the mask region to form at least one trench;

depositing a conductive material layer on the surface of the substrate and within the at least one trench; and removing the mask region and subsequent layers deposited thereon.

25. A method of fabricating nanotube structures comprising the steps of:

providing a substrate with a surface;

depositing a supporting layer on a surface of the substrate;

depositing an active catalyst film layer comprised of a transition metal alloy onto the surface of the supporting substrate; and transforming the supporting layer into a plurality of supporting droplets and transforming the active catalyst film layer comprised of a transition metal alloy into a plurality of active catalyst nanoparticles which adhere to the supporting layer droplets using a reaction chamber having a growth temperature of less than 850° C.; and forming at least one single walled nanotube on the surface of the substrate wherein the at least one single walled nanotube is formed from at least one of the plurality of active catalyst nanoparticles.

26. A method of fabricating nanotube structures as claimed in claim 25 wherein the step of depositing a supporting layer on the surface of the substrate includes the step of depositing a layer of aluminum (Al) on the surface of the substrate.

27. A method of fabricating nanotube structures as claimed in claim 25 wherein the step of forming the at least one nanotube includes a step of using one of methane, ethylene, acetylene, carbon monoxide, and another suitable hydrocarbon gas atmosphere within the reaction chamber.

28. A method of fabricating nanotube structures as claimed in claim 25 wherein the reaction chamber includes one of a chemical vapor deposition chamber, a molecular beam epitaxy chamber, a chemical beam epitaxy chamber, and another suitable chamber.

29. A method of fabricating nanotube structures as claimed in claim 25 further including the step of forming a conductive material layer on the surface of the substrate in electrical connection with the at least one nanotube.

30. A method of fabricating nanotube structures as claimed in claim 29 wherein the conductive material layer includes one of gold, aluminum, platinum, silver, copper, and another suitable conductive material.

31. A method of fabricating nanotube structures as claimed in claim 29 wherein the step of forming a conductive layer on the surface of the substrate, includes forming a plurality of electrodes in electrical connection with the at least one nanotube thereby defining a circuit.

32. A method of fabricating nanotube structures as claimed in claim 31 wherein the step of forming a plurality of electrodes in electrical connection with the at least one nanotube includes the steps of:
  providing a mask region positioned on the surface of the substrate;
  patterning and etching through the mask region to form at least one trench;
  depositing a conductive material layer on the surface of the substrate and within the at least one trench; and
  removing the mask region and subsequent layers deposited thereon.

33. A method of fabricating nanotube structures comprising the steps of:
  providing a substrate with a surface;
  depositing a supporting layer on a surface of the substrate;
  depositing an active catalyst film layer chosen from the group consisting of: nickel (Ni), an iron/cobalt (Fe/Co) alloy, and an iron/nickel (Fe/Ni) alloy onto the surface of the supporting substrate;
  transforming the supporting layer into a plurality of supporting droplets and transforming the active catalyst film layer into a plurality of active catalyst nanoparticles which adhere to the supporting layer droplets using a reaction chamber having a growth temperature of less than 850° C.; and
  forming at least one single walled nanotube on the surface of the substrate wherein the at least one single walled nanotube is formed from at least one of the plurality of active catalyst nanoparticles.

34. A method of fabricating nanotube structures as claimed in claim 33 wherein the step of depositing a supporting layer on the surface of the substrate includes the step of depositing a layer of aluminum (Al) on the surface of the substrate.

35. A method of fabricating nanotube structures as claimed in claim 33 wherein the step of forming the at least one nanotube includes a step of using one of methane, ethylene, acetylene, carbon monoxide, and another suitable hydrocarbon gas atmosphere within the reaction chamber.

36. A method of fabricating nanotube structures as claimed in claim 33 wherein the reaction chamber includes one of a chemical vapor deposition chamber, a molecular beam epitaxy chamber, a chemical beam epitaxy chamber, and another suitable chamber.

37. A method of fabricating nanotube structures as claimed in claim 33 further including the step of forming a conductive material layer on the surface of the substrate in electrical connection with the at least one nanotube.

38. A method of fabricating nanotube structures as claimed in claim 33 wherein the step of forming a conductive layer on the surface of the substrate, includes forming a plurality of electrodes in electrical connection with the at least one nanotube thereby defining a circuit.

39. A method of fabricating nanotube structures as claimed in claim 37 wherein the conductive material layer includes one of gold, aluminum, platinum, silver, copper, and another suitable conductive material.

40. A method of fabricating nanotube structures as claimed in claim 38 wherein the step of forming a plurality of electrodes in electrical connection with the at least one nanotube includes the steps of:
  providing a mask region positioned on the surface of the substrate;
  patterning and etching through the mask region to form at least one trench;
  depositing a conductive material layer on the surface of the substrate and within the at least one trench; and
  removing the mask region and subsequent layers deposited thereon.

41. A method of fabricating nanotube structures comprising the steps of:
  providing a substrate with a surface;
  depositing a first conductive material layer on the surface of the substrate and depositing a second conductive material layer on the surface of the substrate;
  depositing a supporting layer on a surface of the first conductive material layer and the second conductive material layer;
  depositing an active catalyst film layer onto a surface of the supporting layer;
  transforming the supporting layer into a plurality of supporting droplets and transforming the active catalyst film layer into a plurality of active catalyst nanoparticles which adhere to the supporting layer droplets using a reaction chamber having a growth temperature of less than 850° C.; and
  forming at least one single walled nanotube on the surface of the substrate wherein the at least one single walled nanotube is formed with a first end and a second end, wherein the first end of the at least one single walled nanotube is connected to the first conductive material layer and the second end of the at least one nanotube is connected to the second conductive material layer.

42. A method of fabricating nanotube structures as claimed in claim 41 wherein the step of depositing a first conductive material layer on the surface of the substrate and depositing a second conductive material layer on the surface of the substrate includes forming a plurality of trenches using lithography techniques.

43. A method of fabricating nanotube structures as claimed in claim 41 wherein the step of depositing a first conductive material layer on the surface of the substrate and depositing a second conductive material layer on the surface of the substrate includes depositing the first conductive material layer and the second conductive material layer using focused ion beam processing techniques.

44. A method of fabricating nanotube structures as claimed in claim 41 wherein at least one of the first and the second conductive material layers include one of gold, aluminum, platinum, silver, copper, and another suitable conductive material.

45. A method of fabricating nanotube structures as claimed in claim 41 wherein the step of depositing a supporting layer on the surface of the first conductive material layer and the second conductive material layer includes the step of depositing a layer of aluminum (Al) on the surface of the first conductive material layer and the second conductive material layer.

46. A method of fabricating nanotube structures as claimed in claim 41 wherein the step of depositing an active catalyst film layer onto the surface of the supporting layer includes the step of depositing an active catalyst film layer comprised of nickel (Ni).

47. A method of fabricating nanotube structures as claimed in claim 41 wherein the step of depositing an active catalyst film layer onto the surface of the supporting layer includes the step of depositing an active catalyst film layer comprised of a material chosen from the group consisting of: nickel (Ni), an iron/cobalt (Fe/Co) alloy, and an iron/nickel (Fe/Ni) alloy.

48. A method of fabricating nanotube structures as claimed in claim 41 wherein the step of forming the at least one nanotube includes a step of using one of methane, ethylene, acetylene, carbon monoxide, and another suitable hydrocarbon gas atmosphere within the reaction chamber.

49. A method of fabricating nanotube structures as claimed in claim 41 wherein the reaction chamber includes one of a chemical vapor deposition chamber, a molecular beam epitaxy chamber, a chemical beam epitaxy chamber, and another suitable chamber.

50. A method of fabricating nanotube structures as claimed in claim 41 wherein the first and second ends are electrically coupled to the first and second conductive material layers, respectively.

51. A method of fabricating nanotube structures as claimed in claim 41 wherein the step of depositing an active catalyst film layer onto the surface of the supporting layer includes the step of depositing an active catalyst film layer comprised of an alloy.

52. A method of fabricating nanotube structures as claimed in claim 51 wherein the alloy is iron/cobalt (Fe/Co).

53. A method of fabricating nanotube structures as claimed in claim 51 wherein the alloy is iron/nickel (Fe/Ni).

* * * * *